(12) United States Patent
Hillerström

(10) Patent No.: US 6,598,005 B1
(45) Date of Patent: Jul. 22, 2003

(54) METHOD FOR MEASURING THE FREQUENCY OF A SINUSOIDAL SIGNAL

(75) Inventor: Gunnar Hillerström, Linköping (SE)

(73) Assignee: Försvarets Forskningsanstalt, Stockholm (SE)

( * ) Notice: Subject to any disclaimer, the term of this patent is extended or adjusted under 35 U.S.C. 154(b) by 0 days.

(21) Appl. No.: 09/720,814

(22) PCT Filed: Jul. 2, 1999

(86) PCT No.: PCT/SE99/01204

§ 371 (c)(1),
(2), (4) Date: Jan. 3, 2001

(87) PCT Pub. No.: WO00/02056

PCT Pub. Date: Jan. 13, 2000

(30) Foreign Application Priority Data

Jul. 3, 1998  (SE) ............................... 9802394

(51) Int. Cl.⁷ ......................... G01R 23/00; G06F 19/00
(52) U.S. Cl. ..................... 702/75; 702/73; 324/76.39
(58) Field of Search ............... 702/57, 64–66, 702/72, 73, 75–79, 189–191, 198, 199; 324/76.24, 76.42, 76.15, 76.39, 76.53, 76.54; 375/224; 708/309, 311

(56) References Cited

U.S. PATENT DOCUMENTS

| | | | | |
|---|---|---|---|---|
| 4,374,358 A | * | 2/1983 | Hirose ................... | 324/76.58 |
| 4,403,298 A | * | 9/1983 | May, Jr. ................. | 708/322 |
| 4,437,057 A | | 3/1984 | Suzuki et al. .......... | 324/76.39 |
| 4,438,504 A | * | 3/1984 | Favin ..................... | 708/322 |
| 4,928,105 A | | 5/1990 | Langner ................. | 342/192 |

OTHER PUBLICATIONS

Frequenz bestimmung durch Signalabfastung; FREQUENZ, vol. 27, No. 11, 1973, pp 309–311.

* cited by examiner

Primary Examiner—Marc S. Hoff
Assistant Examiner—Manuel L. Barbee
(74) Attorney, Agent, or Firm—Jacobson Holman PLLC

(57) ABSTRACT

A method for measuring a frequency $f=\omega/2\pi$ of a sinusoidal signal $V(t)=A\sin(\omega t+\alpha)$ with an essentially constant amplitude A. Measured values are registered in the form of the instantaneous level of the signal V(t), V(t−h) and V(t−2h) at three points of time separated by a predetermined measuring period h, which corresponds to a measurement frequency $f_s=1/h$. Then the measured values are applied to a calculating device, which recursively estimates the quantity y(t) given by:

$$y(t)=y(t-h)+\eta e(t)s(V(t-h)),$$

where $$e(t) = \frac{V(t) + V(t-2h)}{2} - y(t-h)$$

$V(t-h)$ and $\eta s(V(t-h))V(t-h) \geq 0$, the choice of $\eta$ and $s(.)$ controlling the convergence speed of $y(t) \to \cos(\omega h)$ and the noise sensitivity of the measurement system. Finally the frequency is calculated or looked up in a table based on the expression $f(t)=(f_s/2\pi)\arccos y(t)$.

6 Claims, 4 Drawing Sheets

METHOD FOR MEASURING THE FREQUENCY OF A SINUSOIDAL SIGNAL

BACKGROUND OF THE INVENTION

1. Field of The Invention

The present invention relates to a method for measuring the frequency of a sinusoidal signal.

2. Description of The Related Art

A conventional frequency measuring system, for instance the demodulator in an FM radio, is based on changing the sinusoidal signal into a digital pulse train and then calculating the frequency by counting the number of pulses during a certain period of time. Also when controlling Voltage Controlled Oscillators, VCO, by means of Phase Locked Loops, PLL, the output signal is converted to a pulse train which is digitally divided and phase compared with a digital reference frequency, usually from a frequency stable crystal oscillator.

A common feature of these two methods is that the signal which is the subject of the frequency measurement is limited in terms of amplitude to give a binary signal, and is divided in respect of frequency. In these processes, valuable information disappears that could be used to determine the frequency with increased speed and/or accuracy.

The signal V(t), see FIG. 1, is defined in the following as $V(t)=A\sin(\omega t+\alpha)$, where the amplitude is A, the angular frequency $\omega=2\pi f$ and f is the frequency to be determined. Assuming that A is essentially constant during the time of the frequency measurement, it is easy to derive that $$V(t)+V(t-2h)=A(\sin(\omega(t-h)+\alpha+\omega h)+\sin(\omega(t-h)+\alpha-\omega h))=2A\sin(\omega(t-h)+\alpha)\cos(\omega h)=2V(t-h)\cos(\omega h)$$

or vice versa $$\frac{V(t)+V(t-2h)}{2}=\cos(\omega h)V(t-h) \quad \text{(equation 1)}$$

This is a classical relation which is to be found in several sources, for instance in the journal "Frequenz", Vol. 27, No. 11, 1973, Berlin, pp 309–311: "Frequenzbestimmung durch Signalabtastung", and means that the frequency can essentially be calculated directly from $$\cos(\omega h)=\frac{V(t)+V(t-2h)}{2V(t-h)} \Rightarrow$$

$$f(t)=\frac{1}{2\pi h}\left(2\pi n \pm \arccos\left(\frac{V(t)+V(t-2h)}{2V(t-h)}\right)\right), \quad n\in Z \quad \text{(equation 2)}$$

where Z is the set of all integers; oh designates the normalised frequency.

The ambiguity in the arccos function is avoided (n=0) if the measurement frequency $f_s=1/h$ is at least twice as fast as the highest frequency that is measured. The higher frequencies are therefore usually filtered away in an analog way before the measurements are taken with a so-called anti-aliasing filter. The drawback of this filtering, however, is that higher frequencies then cannot be measured. In the invention defined in this patent application, an anti-aliasing filter is normally not used.

Directly utilising the algorithm according to (equation 2) for frequency determination causes numerical problems in the cases where $V(t-h)\approx 0$. Moreover, only three measured values are used for the frequency determination, which gives the advantage that the method will be fast, but also the drawback that noise, quantization errors etc, if present, result in corresponding errors in the frequency estimation.

SUMMARY OF THE INVENTION

The present invention solves these two problems with the aid of a recursive frequency estimation in the fashion that is evident from the following independent claim. The remaining claims concern advantageous embodiments of the invention.

BRIEF DESCRIPTION OF THE DRAWINGS

The invention will now be described in more detail with reference to the accompanying drawings, in which.

DETAILED DESCRIPTION OF THE PREFERRED EMBODIMENTS

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Figure 2:
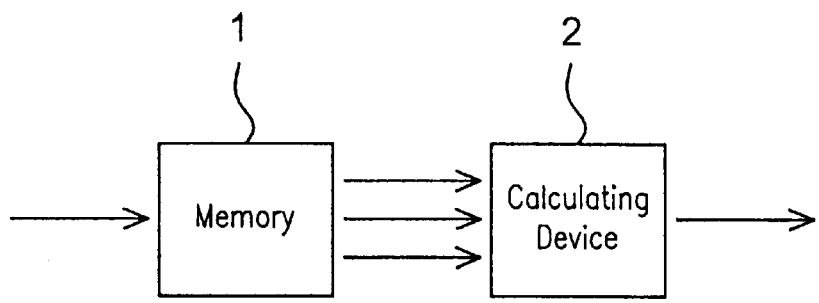
FIG. 2 is a block diagram of a frequency measurement device which in one step, (equation 3.1) and (equation 3.2), uses the invention.

Assume that the estimation y(t−h) of the cosine of the normalised frequency that is available in the y(t) calculation is impaired by an error $-1<\epsilon<1$, i.e. $y(t-h)=\cos(\omega h)+\epsilon$. With reference to FIG. 2, where 1 designates a memory containing V(t), V(t−h) and V(t−2h) and 2 designates a calculating device according to the invention, the following error signal $$e(t)=\frac{V(t)+V(t-2h)}{2}-y(t-h)V(t-h)=\{\text{equation (1)}\}= \quad \text{(equation 3.1)}$$
$$\cos(\omega h)V(t-h)-(\cos(\omega h)+\varepsilon)V(t-h)=-\varepsilon V(t-h)$$

is formed. The estimation is then updated recursively according to $$y(t)=y(t-h)+\eta e(t)s(V(t-h)) \quad \text{(equation 3.2)}$$

wherein $\eta$ s(V(t−h)) V(t−h)$\geq$0. If the convergence factor $\eta>0$, s(.) is selected as a function which has the same signs as its argument, i.e. sign(s(.))=sign(.), e.g. s(V(t−h))=sign(V(t−h)) or s(V(t−h))=V(t−h).

The choice of s(.) and $\eta$ guarantees that the error $\epsilon$ decreases in each iteration step. This results in $y(t) \rightarrow \cos(\omega h)$ at a convergence speed determined by the energy of the incoming signal V(t) and the convergence factor $\eta$ which is selected with respect to the noisiness of the signal and the required convergence speed. If a large η is selected, the measurement noise will have large influence while a small η gives good filtration of the noise, but the calculation converges more slowly.

In a digital implementation, for instance, the function (s(V(t−h))=sign (V(t−h)) may be implemented by changing the sign of the number e(t) if V(t−h)<0. In an analog implementation, s(V(t−h))=V(t−h) may be selected and e(t)·V(t−h) implemented using a sufficiently fast analog multiplier.

Figure 1:
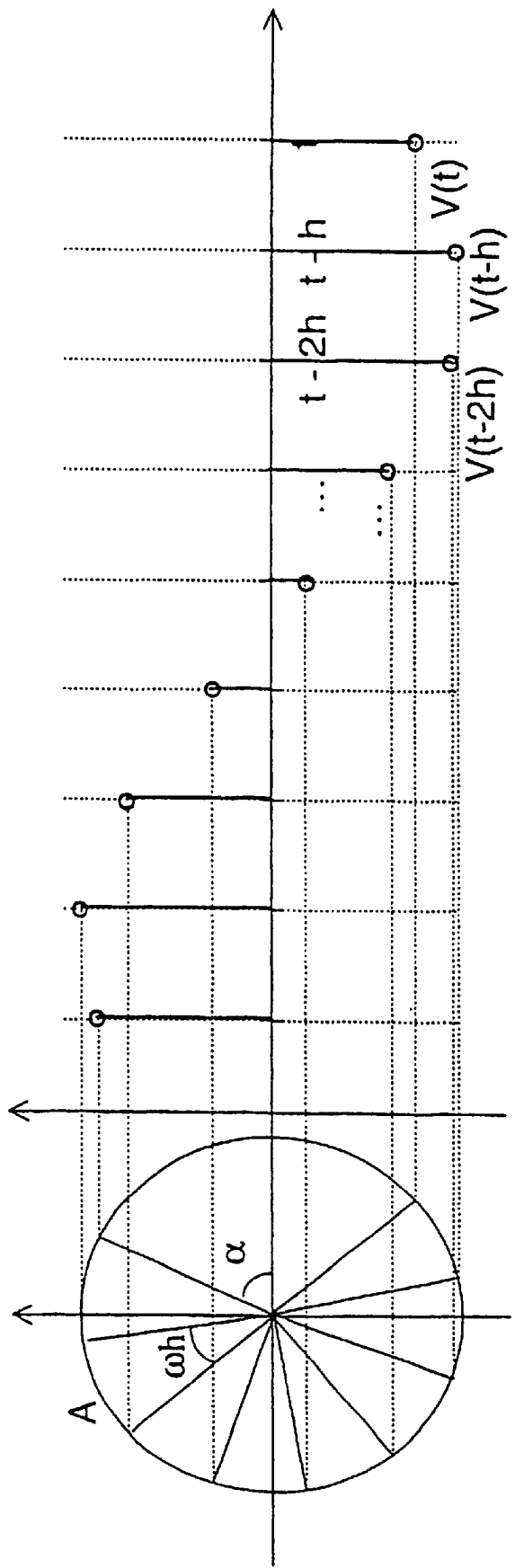
FIG. 1 shows a description of a sinusoidal signal observed at a time interval of h seconds.

The above algorithm, according to (equation 3.1) and (equation 3.2), determines the cosine of the angle through which the argument turns in h second, i.e. cos(ωh), see FIG. 1. If the measurement frequency is increased from zero, the output signal will be close to 1 for low frequencies, ωh≈0, to be 0 at $f_s/4$ and −1 at $f_s/2$, the so-called Nyquist frequency, so as then to increase again to 1 at f=$f_s$. At a further increased frequency, the process will be repeated cyclically.

The lower the sampling speed the better the frequency resolution digitally seen as the number of Hz per change in the least significant bit or analogously as the number of Hz per volt. For the analog measurement device, this will mean longer delay lines and that it will possibly be necessary to compensate for the attenuation in the same.

To maintain the updating rate of the digital frequency measurement device, a lower measurement rate can be implemented by keeping the high sampling rate and storing the measured values in a memory and in the algorithm according to (equation 3.1) applying time-equidistant triples of the measured values. The memory will then be a sampled approximation of the delay lines and the time interval between the measured values when reading from the memory thus determines the measurement frequency.

A digital implementation is normally preferred if a high frequency resolution is desired, which results in low sampling frequencies whereas a low resolution over a wide frequency range is most easily obtained in an analog implementation with short delay lines.

Figure 3:
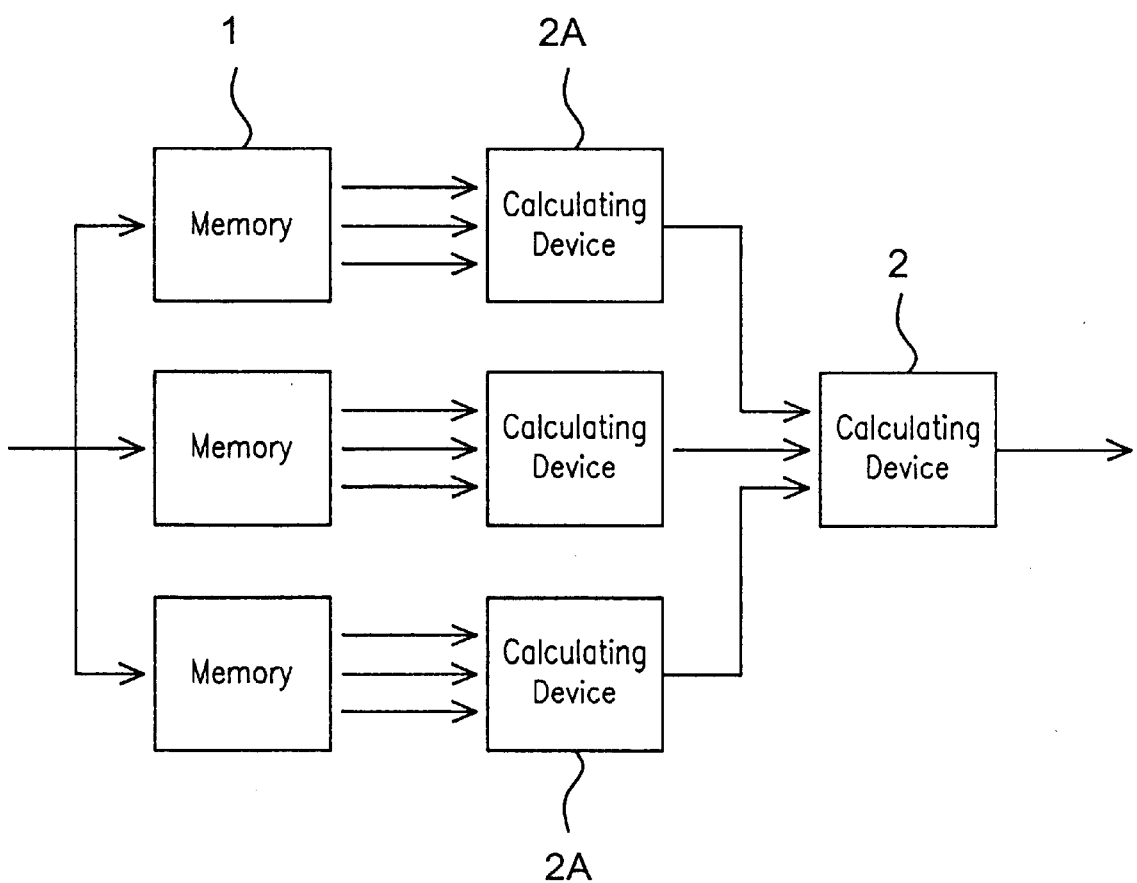
FIG. 3 is a block diagram of a frequency measurement device which in two steps, (equation 3.1) and (equation 3.2), and, respectively, (equation 4.1) and (equation 4.2), uses the invention.

To unambiguously determine the frequency over a wider frequency band than DC to the Nyquist frequency $f_s/2$, it is possible to use three parallel calculating devices 2A with different measurement frequencies $f_{s_i}=1/h_i$, see FIG. 3. It it is desired to determine the frequency up to a selected value which is n times greater $f_b/2=nf_s/2$ $$f_{s_1}=f_b/n \rightarrow h_1=n/f_b$$

$$f_{s_2}=f_b/(n+1) \rightarrow h_2=(n+1)/f_b$$

$$f_{s_3}=f_b/(n+2) \rightarrow h_3=(n+2)/f_b$$

is selected. This implies that the output signal from the different calculating devices will be $$y_1(t) \approx \cos(\omega n/f_b),$$

$$y_2(t) \approx \cos(\omega n/f_b + \omega/f_b),$$

$$y_3(t) \approx \cos(\omega n/f_b + 2\omega/f_b)$$

For the combined frequency measurement device with $y_c(t-h)=\cos(\omega/f_b)+\epsilon_c$ the error signal will be $$e_c(t) = \frac{y_1(t) + y_3(t)}{2} - y_c(t-h)y_2(t) = \ldots = \quad \text{(equation 4.1)}$$

$$\cos(\omega/f_b)y_2(t) - (\cos(\omega/f_b) + \epsilon_c)y_2(t) = -\epsilon_c y_2(t)$$

The estimation is then updated recursively through:

$$y_c(t)=y_c(t-h)+\eta_c e_c(t)s(y_2(t)) \quad \text{(equation 4.2)}$$

where $\eta_c$ s($y_2$(t)) $y_2$(t)≧0, which gives that $y_c(t) \rightarrow \cos(\omega/f_b)=\cos(2\pi f/f_b)$, i.e. frequencies f between DC and $f_b/2$ can unambiguously be determined by means of the same algorithm as is used above for the frequency determination in one step only.

The input signal to the second step in the hierarchy is not obtained as consecutive samples but in parallel. These signals will normally vary more slowly since they describe changes in frequency and not instantaneous values of the incoming signal.

In dependence on how high frequencies are desired to be unambiguously determined, it is possible to use further steps in a hierarchically built frequency measurement device, in which case each group of three calculating devices in the same step uses different measurement frequencies.

As the parallel calculating devices work with different time intervals between the measurements, it is necessary in the digital implementation to synchronise so as to prevent step two from reading when step one is being updated. This can be achieved by generating the ingoing synchronising signals at a higher frequency and then dividing the frequencies digitally by means of counters. By employing the knowledge of where the counters are positioned in their cycles, read/write collisions can be avoided. As the synchronising signals for the calculating devices included in step one all the time drift relative to each other, any read/write blockings between step one and step two will be temporary.

The combined, hierarchically built, frequency measurement device can be used to achieve a high resolution in step one while at the same time in step two and higher steps, if any, giving a rough measurement of a wide frequency band. This may be used, for instance, when controlling by means of frequency locked loop (FLL) different types of equipment which give a frequency as output signal. The invention is particularly suitable in equipment requiring very fast frequency control such as control of a voltage controlled oscillator (VCO). Up to now, it has been necessary to perform such control with a phase locked loop (PLL).

It was initially mentioned as an advantage of the present invention that it does not require any filter which limits the ingoing signal. In some possible applications, one is, however, interested only in signals within a certain frequency range. In these cases, it may be suitable to use a filter, for instance a band-pass filter, which cuts out the desired frequency band.

Figure 4:
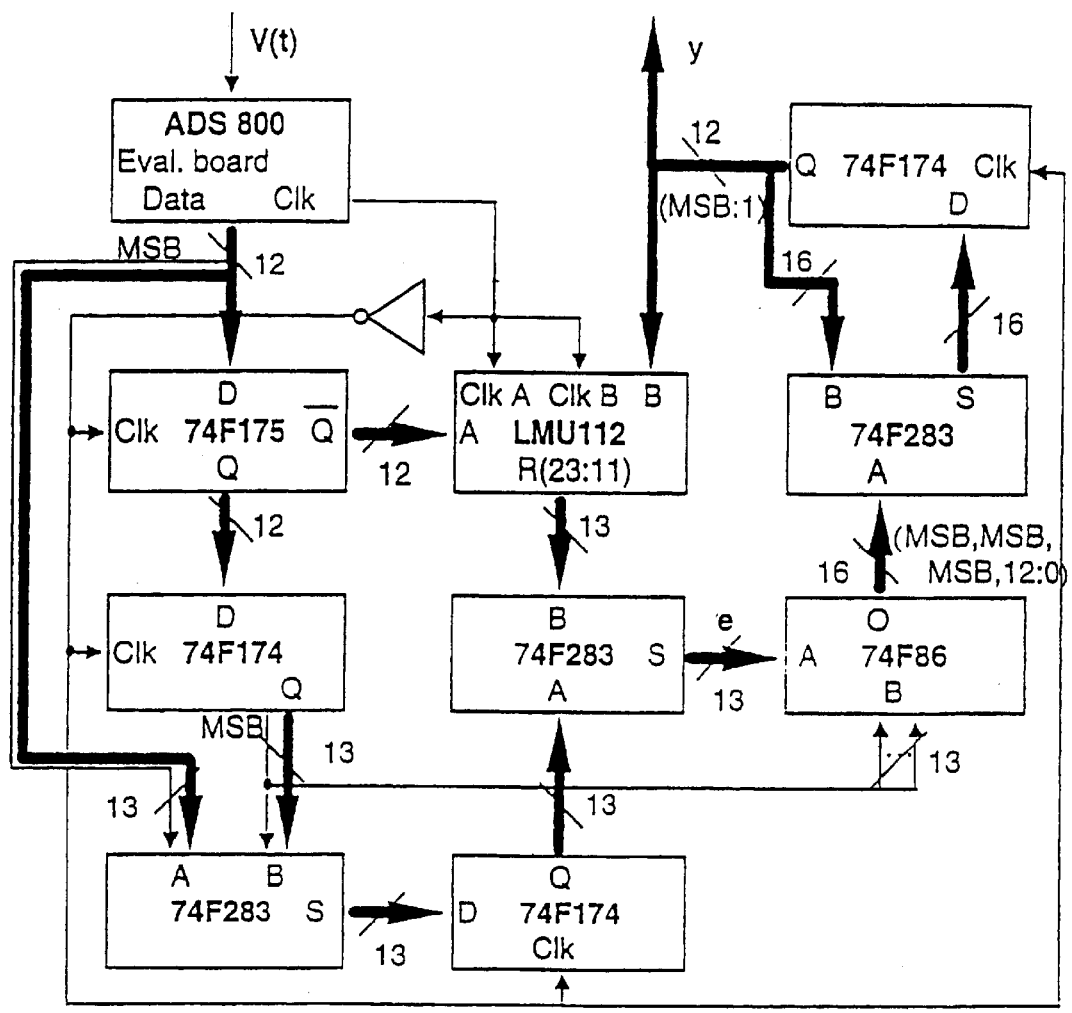
FIG. 4 illustrates a digital implementation of a frequency measurement device in one step according to the invention.

A frequency measurement device according to the invention can in digital form be implemented by means of standard 74Fxxx circuits and A/D converters with a large analog bandwidth and a short aperture time. In the Example in FIG. 4, use is made of a Burr-Brown ADS800 evaluation fixture. The A/D converter which has a 12 bit width and can be clocked with 40 MHz, is set to deliver 2-complementary binary numbers.

In changing the sign of a 2-complementary number, all bits are to be inverted and then 1 is to be added. In the digital implementation according to FIG. 4, the addition by 1 has been ignored. This simplifies the implementation, for instance, s(V(t−h)) is formed by the sign bit of V(t−h), which is also the most significant bit (MSB), being passed in parallel into a number of XOR gates 74F86, so that if V(t−h) is negative, all twelve bits are inverted in parallel.

The multiplication is here implemented with a multiplier circuit LMU112 from Logic Devices. It should be noted that since the multiplier LMU112 contains a pipeline step, an extra delay is introduced and thus the above-mentioned sign bit is taken from V(t−2h) in FIG. 4.

In terms of production and for increasing the performance, in consideration of the fact that the above construction can be clocked with about 10–15 MHz, a programmable logic device, for instance MACH or XILINX circuits, alternatively implementation in silicon, should be used. In such a solution, a correct sign change, i.e. the addition by 1 after inversion, should also be included.

Figure 5:
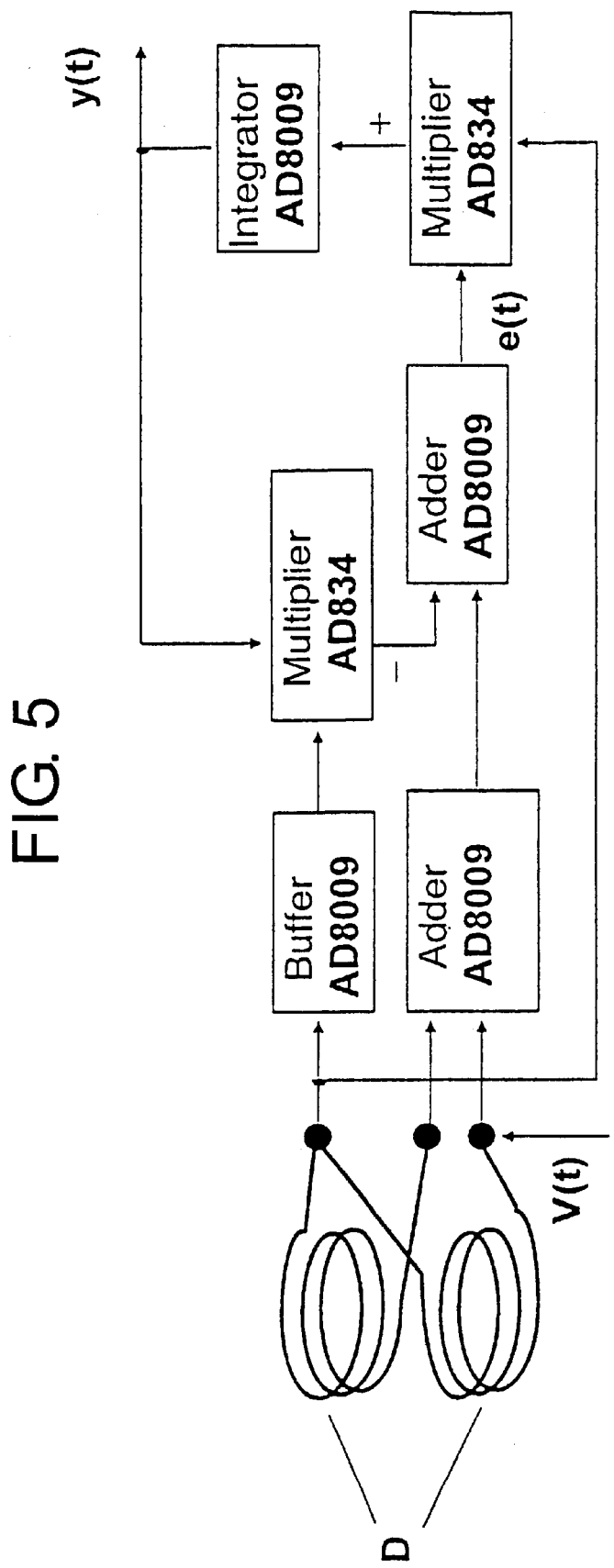
FIG. 5 shows an analog implementation of a frequency measurement device in one step according to the invention.

An analog implementation of (equation 3.1.) and (equation 3.2) is shown in FIG. 5. In the implementation, use is made of the operation amplifier AD8009 and the multiplier AD834 from Analog Devices. The signal is passed through two delay lines D and the potential between these V(t−h) is measured by means of a buffer amplifier. The delay lines each have the delay h and can suitably consist of coils of semirigid coaxial cable.

The average value (V(t)+V(t−2h))/2 and e(t) is formed by means of summing amplifier couplings. In the implementation, use is made of s(V(t−h))=V(t−h), which implies that the integrator should be updated with the multiplication between the error e(t) and V(t−h).

The invention being thus described, it will be apparent that the same may be varied in many ways. Such variations are not to be regarded as a departure from the spirit and scope of the invention, and all such modifications as would be recognized by one skilled in the art are intended to be included within the scope of the following claims.

What is claimed is:

1. A method for measuring with a measurement system a frequency f=ω/2π of a sinusoidal signal V(t)=A sin(ωt+α) having an amplitude A which is essentially constant during a measurement interval, comprising registration of measured values in the form of an instantaneous level of the signal V(t), V(t−h) and V(t−2h) at three points in time separated by a predetermined measuring period h, where t designates a running time, which corresponds to a measurement frequency $f_s$=1/h, with the measured values being applied to a calculating device which recursively estimates a quantity y(t) given by $$y(t)=y(t-h)+\eta e(t)s(V(t-h)),$$

where $$e(t) = \frac{V(t) + V(t-2h)}{2} - y(t-h)$$

V(t−h) and ηs(V(t−h))V(t−h)≧0, where a choice of η and s(.) controls a convergence speed of y(t)→cos(ωh) and a noise sensitivity of the measurement system, and with a frequency being calculated or looked up in a table based on an expression f(t)=($f_s$/2π)arccos y(t).

2. The method as claimed in claim 1, and using a hierarchically built frequency measurement device, such that, in a first step, the measured values are applied in parallel to a group of three calculating devices with the measuring frequencies $f_{s_1}$=$f_b$/n, $f_{s_2}$=$f_b$/(n+1), $f_{s_3}$=$f_b$/(n+2), which results in three output signals $y_1$(t)≈cos(ωn/$f_b$), $y_1$(t)≈cos(ωn/$f_b$), $y_3$(t)≈cos(ωn/$f_b$+2ω/$f_b$), said output signals being applied, in a second step, as input signals to a fourth calculating device recursively estimates a quantity $y_c$(t) given by $$y_c(t)=y_c(t-h)+\eta_c e_c(t)s(y_2(t))$$

where $$e_c(t) = \frac{y_1(t) + y_3(t)}{2} - y_c(t-h)y_2(t)$$

and $\eta_c$s($y_2$(t))$y_2$(t)≧0, whereupon the frequency is calculated or looked up in a table based on an expression f(t)=($f_b$/2π)arccos $y_c$(t).

3. The method as claimed in claim 1, wherein measured values are registered at a higher rate than a desired measurement rate and stored in a memory from which time-equidistant triples of measured values are taken as input signals to the frequency measurement.

4. The method as claimed in claim 1, wherein the calculated frequency serves as frequency measurement of a closed loop control to form a frequency locked loop.

5. The method as claimed in claim 4, wherein the control is based on a difference cos(2π$f_{des}$/$f_s$)−y(t) where $f_{des}$ is a desired frequency reference value.

6. The method as claimed in claim 4, wherein the control includes a Voltage Controlled Oscillator.

* * * * *